United States Patent
Siepmann (10) Patent No.: US 8,358,931 B2
(45) Date of Patent: Jan. 22, 2013

(54) SYSTEM AND METHOD FOR PRECISE, ACCURATE AND STABLE OPTICAL TIMING INFORMATION DEFINITION INCLUDING INTERNALLY SELF-CONSISTENT SUBSTANTIALLY JITTER FREE TIMING REFERENCE

(76) Inventor: James P. Siepmann, Oshkosh, WI (US)

( * ) Notice: Subject to any disclaimer, the term of this patent is extended or adjusted under 35 U.S.C. 154(b) by 1090 days.

(21) Appl. No.: 10/692,175

(22) Filed: Oct. 22, 2003

(65) Prior Publication Data

US 2004/0264959 A1 Dec. 30, 2004

Related U.S. Application Data

(60) Provisional application No. 60/434,539, filed on Dec. 18, 2002.

(51) Int. Cl.
*H04J 14/00* (2006.01)

(52) U.S. Cl. ............... 398/53; 398/102; 398/161

(58) Field of Classification Search ............ 398/45, 398/53, 102, 161, 141, 142, 145, 106, 13, 398/12, 19, 20, 28, 34, 35, 47, 52, 54, 55, 398/56, 75, 98, 51
See application file for complete search history.

(56) References Cited

U.S. PATENT DOCUMENTS

| | | | | |
|---|---|---|---|---|
| 5,402,256 A | * | 3/1995 | Spanke | 398/53 |
| H1626 H | * | 1/1997 | Kersey et al. | 370/479 |
| 5,691,832 A | | 11/1997 | Liedenbaum et al. | |
| 6,967,977 B2 | | 11/2005 | Hasson | |
| 2001/0010739 A1 | * | 8/2001 | Takiguchi et al. | 385/15 |
| 2004/0114211 A1 | * | 6/2004 | Trepagnier et al. | 359/328 |

* cited by examiner

*Primary Examiner* — M. R. Sedighian
(74) *Attorney, Agent, or Firm* — David T. Millers (57) ABSTRACT

An optoelectronic timing system includes an optical timing compensation system in which optical pulses developed by a semiconductor laser are advanced or retarded based upon an expected arrival time. The pulses are directed into a number of time-quantifiable optical paths. Time quantification for a pulse is based upon the time required for a pulse to travel a particular length at the speed of light. Pulses are directed into an advancing path or a retarding path by optical switches which compare an expected arrival time of a new pulse to an expected arrival time based on a previous pulse. The optical compensation system is incorporated into a precision timing device in which multiple optical paths, having decreasing lengths in a defined pattern, are arranged in serial fashion so as to have each subsequent path of the series represent a travel time one order of magnitude different than a travel time of an adjacent path. Timing signals are developed by coupling an optical detector to each of the multiple optical paths.

13 Claims, 6 Drawing Sheets

SYSTEM AND METHOD FOR PRECISE, ACCURATE AND STABLE OPTICAL TIMING INFORMATION DEFINITION INCLUDING INTERNALLY SELF-CONSISTENT SUBSTANTIALLY JITTER FREE TIMING REFERENCE

CROSS REFERENCE TO RELATED APPLICATIONS

The present application is related to and takes priority from U.S. Provisional Patent Application entitled "System And Method For Precise, Accurate And Stable Optical Timing Information Definition", Ser. No. 60/434,539, filed Dec. 18, 2002, and is further related to U.S. patent application Ser. No. 10/691,869, entitled "System And Method For Developing High Output Power Nanosecond Range Pulses From Continuous Wave Semiconductor Laser Systems", now U.S. Pat. No. 7,869,477, and U.S. patent application Ser. No. 10/692,176, entitled "System And Method For Precise, Accurate And Stable Optical Timing Information Definition", all commonly owned by the assignee of the present invention, the entire contents of which are expressly incorporated herein by reference.

FIELD OF THE INVENTION

The present invention is directed generally to optical timing systems and, more particularly to systems and methods for generation and processing of high speed native timing signals in the gigahertz region.

BACKGROUND OF THE INVENTION

Internationally, telecommunications is undergoing major rapid change brought about by regulatory changes, increasingly open markets and technological advances in integrated circuits, optical devices, and computer systems. The convergence and the integration of these technologies, coupled with the driving factors of faster transmission speeds, lower signal levels, and denser circuit boards has made managing signals in electronic and communication switching systems critical.

These driving factors have placed a greater emphasis on managing problems relating to signal integrity, timing distribution, timing jitter, signal distribution, noise, asynchronism, and cross-talk. In long-haul transmission domain optical amplifiers, together with wavelength-division multiplexed have revolutionised high speed data transmission by providing flexible and cost-effective means of amplifying and processing of signals almost entirely in the optical domain independent of data rate and protocols.

Impairments suffered by timing signals play a critical role in electronic systems. They limit the dynamic range of an analogue-to-digital converter, the throughput of a digital bus, affect the behaviour of digital synchronisers, influence the bit error ratio of a communications link, and determine the sensitivity and selectivity of radio receivers. Timing impairments are the result of random noise and systematic disturbances within electronic devices and interconnections.

Electronically derived timing signals suffer from an additional inherency constraint; the limits of electronic system frequency response is predicated on the internal parasitic capacitances developed as an artifact of the functional underpinnings of active semiconductor integrated circuit devices. The familiar P-N junction which forms the basis of active device fabrication, whether expressed in terms of majority or minority carrier devices, nevertheless inherently compels a parasitic capacitance be coupled into the elemental circuit model.

Thus, in the rapidly advancing telecommunications field for example, electronically generated timing signals are becoming increasingly problematic as fundamental limits of integrated circuit frequency response are reached. However, the burgeoning field of optoelectronics offers a means of avoiding a strict dependence on electrical/electronic timing signal generation. Optoelectronics is predicated upon optical signal processing and inherently includes technologically satisfactory structures for confining and transmitting optical pulses over great distances. Since the speed of light has a well recognized constant value, given a particular transmission medium, a light pulse can be utilized to define a non-relative and non-relativistic methodology for measuring time as well as time intervals. A light pulse traveling at a constant velocity, traversing a known distance, in the same reference frame as an observer, provides a simple and inherently stable method for defining a time interval. Mechanical definition of a multiplicity of branching travel paths offers a straight forward way of constructing a timing generator characterized by timing trigger edges having native periodicities in the gigahertz and multi-gigahertz regime.

SUMMARY OF THE INVENTION

In an optoelectronic timing system, an adaptive frequency generator system comprises at least one semiconductor laser configured to issue subnanosecond optical pulses defining a periodic pulse train. At least a first optical waveguide is configured to define a first time-quantifiable optical path for a pulse of the train and at least one additional optical waveguide is configured to define a second time-quantifiable optical path for a pulse of the train different from the first waveguide.

Pulses of the train are directed into the first and second waveguides at a first nodal point coupled to the first and second waveguides and pulses directed into the first and second waveguides are recombined at a second nodal point coupled to the first and second waveguides. The length of the second time-quantifiable optical path has a defined numerical relationship to the length of the first time-quantifiable optical path, such that the periodicity of pulses recombined at the second nodal point has the same numerical relationship with the periodicity of the issued pulse train.

In one aspect of the invention, the at least one semiconductor laser is configured to provide a pulsed output having a periodicity in the range of about 1 nanosecond so as to define a 1 gigahertz pulse train. Additionally the second optical time-quantifiable optical path has a length differing from the first time-quantifiable optical path by about 0.5 nanoseconds, so as to define a 2 gigahertz pulse train at the second nodal point.

One feature of the present invention allows expansion of the number of time-quantifiable optical paths to provide for adaptively shorter periodicities. In this aspect, the invention comprises a multiplicity of additional optical waveguides each coupled to the first and second nodal points, the additional waveguides configured to define a multiplicity of time-quantifiable optical paths. The lengths of each of the multiplicity of additional time-quantifiable optical paths having a numerical relationship with each other and with the first time-quantifiable optical path. The semiconductor laser is configured to provide a pulsed output at a first periodicity and wherein the recombined pulse train at the second nodal point provides a pulse train having a second periodicity, the second periodicity being a multiple of the first, the multiple defined by the numerical relationship between the multiplicity of additional time-quantifiable optical paths and the first time-quantifiable optical path.

As an example, the semiconductor laser operates at a frequency of about 1 gigahertz and the lengths of the multiplicity of time-quantifiable optical paths differ from one another by about 0.2 nanoseconds, so as to define a 5 gigahertz pulse train at the second nodal point. Characteristically, time quantification of the optical path length is defined by the distance required for a pulse to travel at the speed of light for a given time interval.

In an optoelectronic timing system, an adaptive frequency generator system comprising:
  at least one semiconductor laser configured to issue sub-nanosecond optical pulses defining a periodic pulse train;
  a multiplicity of optical waveguides, the waveguides configured to have physical lengths differing from one another by a numerical relationship, each length defining a time-quantifiable optical path for a pulse of the train based upon the time required for a pulse to travel a particular length at the speed of light;
  a first nodal point coupled to the multiplicity of optical waveguides at which pulses of the train are directed into the multiplicity of optical waveguides;
  a second nodal point coupled to the multiplicity of optical waveguides at which pulses directed into the multiplicity of optical waveguides are recombined; and
  wherein, the periodicity of pulses recombined at the second nodal point has the same numerical relationship with the periodicity of the issued pulse train as the numerical relationship of the multiplicity of optical waveguides.

In a further aspect, the invention comprises a pulse detector and a regenerator coupled to the pulse detector and semiconductor laser. A regeneration waveguide having a length equal to the longest length of the multiplicity is coupled to receive pulses from the laser. The regeneration waveguide is not coupled to the first or second nodal points. A pulse traveling the regeneration waveguide is directed to the pulse detector and regenerator so as to trigger the laser to issue a next pulse. The physical length of the regeneration waveguide defines a fundamental frequency of the system.

The periodicity of pulses recombined at the second nodal point accordingly defines a frequency which is a multiple of the fundamental frequency of the system, the numerical value of the multiple being equal to the number of the multiplicity of optical waveguides. As an example, were the fundamental frequency of the system to be defined as 1 gigahertz, i.e., 1 nanosecond, five (5) waveguides differing from one another by 0.2 nanoseconds would define a five (5) gigahertz pulse train. Lengths of the wave guides are defined in accordance with a numerical relationship based on the distance required for an optical pulse to traverse in one (1) nanosecond while traveling at the speed of light in the medium defining the wave guide.

Waveguides may be disposed in semiconductor material, provided as optical fiber, doped or undoped, or provided as a free-space path in either a vacuum or a gaseous ambient.

BRIEF DESCRIPTION OF THE DRAWINGS

These and other features, aspects and advantages of the present invention will be more fully understood when considered with respect to the following specification, appended claims and accompanying drawings, wherein:

DESCRIPTION OF THE INVENTION

Continuous wave laser diodes are well known in the semiconductor laser arts. They provide a low cost and physically small solution for development of optical and optoelectronic systems. While very useful in optical data transmission applications, continuous wave lasers have significant disadvantages when used in optical timing applications, not the least of which is their conventional inability to deliver a pulsed output signal with a sufficiently high output power. This is quite disadvantageous when a continuous wave laser is coupled to an optical transmission path such as a waveguide or optical fiber.

Optical transmission paths are known to attenuate laser signal energy as well as disperse the output waveform (a process termed pulse spreading) thereby requiring periodic electronic amplification and pulse squaring circuitry to be provided in the signal path. Where the initial output signal is relatively weak, such amplification and shape processing must be provided more frequently, resulting in expensive and highly complex installations. Accordingly, although able to be operated in a pulse mode, continuous wave semiconductor lasers have not been considered for timing applications because of what is conventionally considered their inherently limited output power characteristics.

It has been determined, however, that virtually all continuous wave laser diodes are able to be operated in a certain manner in order to achieve a high power pulsed output by operationally exercising them using a sub nanosecond input pulse having an IV (power) characteristic at or exceeding a particular derived current-voltage (IV) threshold described in more detail below. The operation of continuous wave laser diodes in this manner is not described in any manufacturer's data sheets nor are they currently known by those having skill in the art. Indeed, the particular current-voltage thresholds required to operate these lasers in a high output power pulse mode is far above the manufacturer's optimum operating levels, and indeed far exceeds the nominal input threshold for any semiconductor laser diode examined.

Although the input characteristics are far in excess of nominal tolerance levels, this is not considered to pose any operational dangers, because the input pulse is defined as having a duration of less than about one nanosecond and a duty cycle of about less than a 25%. Consequently, there is not enough time for heat accumulation to occur and therefore no thermal damage is imparted to the laser material. The use of continuous wave lasers in this manner is not isolated to any particular laser diode composition nor is it limited to lasers operating within any particular wavelength regime. The operational characteristics of the present invention have been demonstrated on various laser compositions including AlGaIn, AlGaInP, GaAlAs, AlGaAs, and the like, having wavelengths of from about 600 nanometers to about 1600 nanometers.

Even for those few continuous wave laser diodes that do have a pulse mode defined by the manufacturer, the stated output for these diodes is typically far below what one is able to achieve for a pulsed output in accord with the invention. For example, the Hitachi HL7581G can be pulsed per the manufacturer's specifications at approximately 2V but is only capable of achieving an output pulse with a power characteristic of from about 50 to about 60 milliwats. A continuous wave laser operated in accordance with the present invention is able to define a pulsed output exhibiting a considerably higher output power; in the case of the Hitachi HL7581G, operating the laser diode in accordance with the invention will allow one to achieve a 3000 milliwatt output, i.e., about two orders of magnitude higher output power than previously contemplated.

Specifically, it should be understood that the majority of the semiconductor continuous wave lasers are designed to operate with an input voltage of from about 2.5 V to about 3 V and require an input current of from about 50 to about 150 milliamps, for continuous wave operation. In the case of the Hitachi HL7581G, mentioned previously, the specified input threshold current is about 45 milliamps (at 25 C) and the output power, as a function of injection current, is specified to follow an approximately 0.5 milliwatt per milliamp slope (conventionally termed a 0.5 mW/mA slope efficiency). Nominal operating current is about 140 milliamps at the nominal 50 mW output.

Where a pulse mode is explicitly stated, the operational characteristics are such that they remain generally within the specified input and output constraints of continuous wave operation. In the Hitachi HL7581G case, pulsed operation is allowed with a pulsed optical output power of about 60 mW, a 50% maximum duty cycle and a maximum pulse width of about 1 microsecond. Typically, the maximum continuous wave output of conventionally operated continuous wave devices ranges from about 5 to about 70 milliwatts, for typical laser diodes having nominal input impedances of generally less than 1 Ohm (typically in the range of about 0.2 Ohms). When the maximum specified injection current (I) is considered for a range of continuous wave laser diodes, along with their specified maximum operating voltage (V), is it relatively simple to derive a range of corresponding operational input power characteristics (IV=W) for these lasers of from about 0.025 Watts to about 0.35 Watts.

In accordance with the present invention, a continuous wave laser may be operated at a particular input regime, characterized by a particular operational input power characteristic (a current-voltage threshold termed herein the Siepmann Threshold or ST) in order to obtain a high output power pulse in the subnanosecond range. This threshold (ST) is experimentally determined for each laser diode, and typically lies in the range of from about 2.0 to about 6.2 Watts, depending on the particular laser diode composition and construction under investigation. Once the ST threshold has been determined for each laser diode, that laser may be operated to obtain output pulses having similar power characteristics, i.e., output pulses in the range of about 3000 milliwatts. Although not particularly relevant to practice of the invention, it has been observed that the Siepmann Threshold appears to have a direct proportionality relationship to the surface area of the laser diode at issue, all other factors (such as composition and wavelength) being equal.

In particular, the lowest current-voltage threshold necessary to achieve a subnanosecond high power pulsed output from each of the continuous wave laser diodes evaluated, ranged on the order of from about 12 to about 160 times the manufacturer's maximum input power ratings for the particular laser diode at issue. The Siepmann threshold may be obtained for virtually any continuous wave laser diode, with the maximum output of each diode being found somewhere in the range of from about one to about two times the ST threshold for that diode.

Operationally, and in accordance with principles of the invention, the Siepmann Threshold (ST) is found by applying a substantially increased injection current to the device at an increasing operating voltage (Vop) and evaluating the device's output characteristic. The current injection is provided in pulse fashion and is generally in the range of from about 200 picoseconds to about 600 picoseconds, but it could be substantially less. The pulse width should, however, be maintained in the range of less than 1 nanosecond. In order to avoid damage to the diode, it will be necessary to maintain the input pulse at a duty cycle of less than about 25%, and preferably less than about 20%. Input current and operating voltage are increased until the device's output characteristic exhibits a substantial and quite surprising jump in measured output power. Notably, the output power increase is not linear. Output power remains generally within specified tolerances until the ST threshold is reached for each diode. At the ST threshold, however, the output power characteristic jumps at least one order of magnitude and typically two orders of magnitude.

It should further be mentioned that the ST threshold may be conveniently found by starting the procedure utilizing the laser diode manufacturer's rated maximum operating voltage and injecting an operating current in the range of about 1 Amp. From this starting point, one having skill in the art can easily determine a set of current-voltage matrix values that will identify the point at which the ST threshold determines operation of the device. Current may be swept, with voltage incrementally stepped for each sweep, or vice versa. Alternatively, a set of IV "corner" values may be generated and IV sweeping performed about the corners in accord with well understood principles of experimental statistical data analysis.

The minimum target input power is about 2.0 Watts, with several devices exhibiting ST thresholds in the range of about 6 Watts. Notably, it would appear that increases in the operating voltage have a more beneficial effect in deriving the ST threshold than increases in the injected current. Pulsing a CW laser diode with an input pulse amplitude in the 4000 to 5000 millivolt region, while maintaining the input current in the 1 Amp region seems to be able to develop the ST threshold for most devices.

Figure 1:
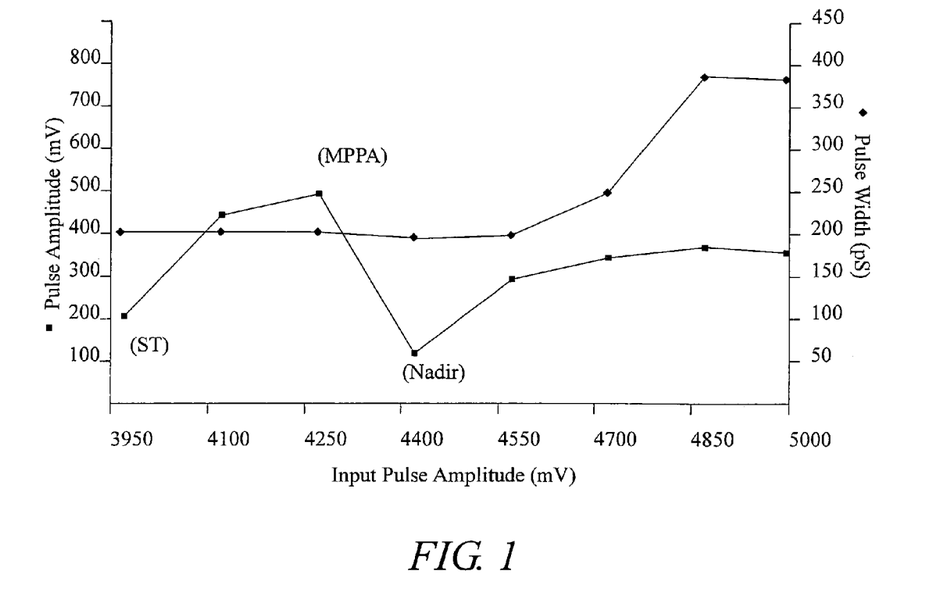
FIG. 1 is a simplified, semi-schematic output trace of laser pulse amplitude and pulse width as a function of input pulse amplitude and power.

Turning now to FIG. 1, there is shown an exemplary output characteristic curve developed for a typical continuous wave laser diode operated at and above its derived ST threshold. In the example of FIG. 1, a high output subnanosecond pulse is developed at an observed ST threshold corresponding to approximately 4.0 Watts. Data was taken utilizing an input current of relatively constant value at approximately 1.0 Amps; thus the input pulse amplitude is characterized in terms of voltage (i.e., an ST threshold of about 4000 mV). When so operated, a photonic pulse develops at the threshold and exhibits an initial output pulse amplitude characteristic in the range of about 200 mV, at a pulse width substantially equal to the input pulse width of about 150 picoseconds. The photonic pulse amplitude increases as the input pulse amplitude increases until a maximal photonic pulse amplitude (MPPA) is developed.

In the example of FIG. 1, the MPPA is observed to be in the region of about 500 mV, or about at least two times the pulse amplitude at the ST threshold. After the maximal photonic pulse amplitude is reached, further increases in the input pulse amplitude will actually cause a decrease in the photonic pulse amplitude until a nadir is reached. Typically, this occurs at about an input pulse amplitude of 5% to 7% beyond the ST threshold amplitude (about 4270 mV in the example of FIG. 1). Although a nadir in output pulse amplitude is experimentally observed, the output pulse amplitude value at the nadir is still generally in the region of the output pulse amplitude defined at the ST threshold. It has been experimentally determined that the MPPA will not again be reached after the nadir no matter how much the input pulse amplitude is increased; indeed, the output pulse amplitude is observed to plateau at a level somewhat below (approximately 5% to 10% below) the maximum output pulse amplitude developed at the MPPA.

The output pulse width, which remains generally stable until the post MPPA nadir, is observed to increase as the input pulse amplitude increases beyond the value defining the photonic pulse nadir. Output pulse widths are stretched from the nominal input pulse widths to about twice the nominal input value. The example of FIG. 1, indicates output pulse stretching from a nominal value of about 200 picoseconds to a value of about 400 picoseconds at an input amplitude of about 15% to about 20% in excess of the ST threshold. Notionally, the output pulse width remains stable at about the input pulse width across the range of input amplitudes from the ST threshold to at least the nadir.

Accordingly, it will be understood that operating a continuous wave laser diode, in accordance with the invention, is able to define a device which is capable of developing a subnanosecond pulsed output with an output power characteristic significantly larger than conventionally operated diodes. Those having skill in the art will understand that a relatively simple continuous wave semiconductor laser diode may now be utilized as an optical timing device due to its previously unknown high output power pulse characteristics. The use of continuous wave laser diodes for subnanosecond pulsing in this manner in order to achieve extremely high outputs is not commonly known to those practiced in the art and indeed represents a highly surprising result. This novel use allows one to achieve a high pulse output with inexpensive laser diodes that could otherwise only have been achieved with expensive pulse laser systems costing thousands of dollars. Additionally, this allows small semiconductor lasers to be used in combination with semiconductor electronic circuitry in order to manufacture small and inexpensive high speed optoelectronic timing devices.

Figure 2:
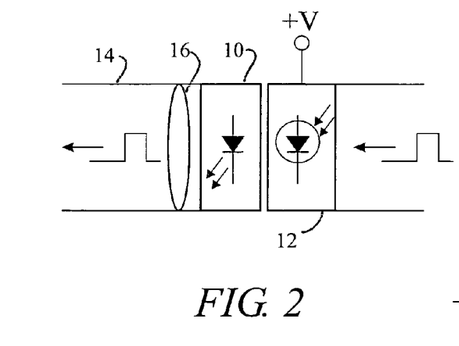
FIG. 2 is a simplified, semi-schematic structural diagram of one embodiment of a laser retriggering circuit in accordance with the invention.

Turning now to the exemplary embodiment of FIG. 2, the novel high power pulse mode laser diode described above can be adapted to provide a light-based timing/clocking device with operational characteristics that have not been realized beforehand. In the particular embodiment of FIG. 2, the invention is directed to a semiconductor laser which is able to deliver a subnanosecond output pulse having an amplitude characteristic in the range of more than 100 milliwatts at a pulse duty cycle of anywhere from about 1% to about 25%. The semiconductor laser, indicated at 10, is overdriven at or above the ST threshold, as described above, and is triggered by an injection current derived from a photoconductive or capacitive trigger device 12, thereby yielding a high power laser output pulse that is less than one nanosecond in duration. In the illustrated embodiment the semiconductor laser is coupled in series with an optical fiber or an optical waveguide 14 which functions as the timing path element, in a manner to be described in greater detail below. When the device is used in a closed-loop mode, i.e., an initial pulse, or a portion thereof, is used to trigger a next or subsequent pulse, approximately 20 percent of the laser initial output pulse is fed back to the trigger (photoconductive or capacitive trigger) 14 where it causes an additional laser pulse to be generated and propagated into the waveguide.

As was described previously, the wavelength of the laser pulse, whether initial or subsequent, is not as crucial to timing operations as the stable functioning of the semiconductor laser itself. Accordingly, care should be taken to define the trigger output characteristics such that they meet the laser's determined ST threshold, and preferably the laser's determined MPPA. Additionally it is contemplated that any output pulse derived from the laser diode is collimated with a collimating lens 16, in order to minimize dispersion of the output pulse and maximize optical power in each pulse propagated through the fiber or waveguide.

Figure 3:
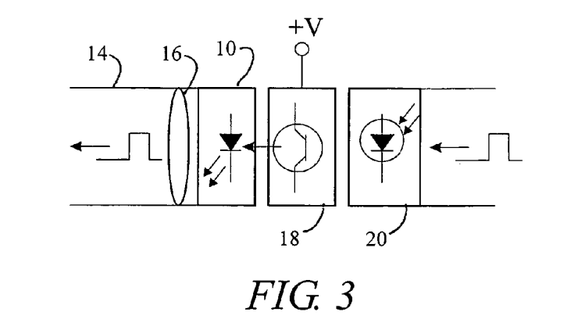
FIG. 3 is a simplified, semi-schematic structural diagram of a second embodiment of a laser retriggering circuit in accordance with the invention.

As shown in the exemplary embodiment of FIG. 3, the photoconductive/capacitive layer may be further defined as comprising a capacitor-type semiconductor injection trigger 18 coupled to a semiconductor photodetector 20. When the device is used in a closed-loop mode, approximately 20 percent of the laser output pulse is fed back to the semiconductor photodetector 20 which then sets off the capacitor-type semiconductor injection trigger 18, in turn retriggering the laser 10 to develop a pulse. As was the case in the exemplary embodiment of FIG. 2, the laser is coupled to an optical fiber or waveguide which propagates the pulse and includes means for dividing approximately 20% of the pulse and directing what might be termed the trigger pulse back to the photodetector for subsequent retriggering.

Particularly suitable types of devices that might be used in this connection include MOS photocapacitors similar to those implemented in conventional CCD image capture and reproduction technology. It has become apparent that CCD technology is able to be used in many different potential applications, including signal processing and imaging, particularly because of silicon's light sensitivity. Silicon responds to photons in the optical spectrum at wavelengths less than about 1.0 mm. This is relatively important since the visible spectrum falls between 0.4 mm and 0.7 mm and the majority of semiconductor CW laser diodes exhibit dominant output modes in the visible range. The CCD's superb ability to detect light has turned it into the industry-standard image sensor technology.

Further, CCD devices inherently involve a charge transfer mechanism, which is easily coupled as a trigger to a high-speed charge amplification device such as a voltage follower configured BJT or an SCR coupled to discharge a capacitor circuit upon receipt of a nominal trigger current value. Although the illustrated embodiments of FIGS. 2 and 3 have discussed photodetectors and capacitor-type trigger devices, it will be understood that these have been discussed only for purposes of example and not to limit the construction and operation of the device. Photodetectors and triggers might also be thought of as comprising initiator devices and/or regenerator devices that function to cause the laser diode to issue an appropriate pulse. Accordingly, a suitable regeneration amplifier is implemented as any form of electronic device operationally responsive to an optical pulse in the generally visible range of the spectrum, and outputting a substantially high power trigger pulse in the subnanosecond region; such a regeneration amplifier should be able to switch current throughout at least 500 MHz. As mentioned above, a bipolar switch might be particularly suitable when it is understood that a high speed timing device should be able to switch the laser operationally at speeds of about 500 MHz at current levels at about 500 milliamps.

It should also be understood that a timing device constructed in accordance with the invention might operate in two different modes, and open-loop mode and a closed-loop mode. When operating in an open-loop mode, the device might be controlled by a voltage controlled oscillator (VCO) with clock speeds in excess of one gigahertz (1 GHz) being achieved by a suitable definition of the optical path, as will be described in greater detail below. In a closed-loop mode, as was described above, the trigger input for subsequent pulse development is taken from at least a portion of the initial, or some previous, pulse from a well defined distance along the optical path itself.

In accordance with principles of the invention, an optical timing device utilizes the speed of light in an ambient medium traversing a defined travel distance "d" in order to derive a stable time interval "t". An optoelectronic device, in accordance with the invention, is predicated upon utilization of the speed of light, with a light pulse traversing either an optical fiber or a wave guide for a known distance, in order to define a known time. In effect, timing becomes a function of known distance, as opposed to a function of the vagaries of electrical or electronic switching devices.

For purposes of example, the speed of light is taken to be $3\times10^8$ meters per second. Although this is not precise, and also refers to the speed of light in a vacuum, the value of $3\times10^8$ meters per second is sufficient for exemplary purposes. Additionally, the speed of light in other media will be understood by those having skill in the art to depend upon the index of refraction of that medium. While these differences exist, they will be deemed to be not particularly relevant for purposes of description. The actual values used in the context of the discussion must be recognized as exemplary only and chosen solely for ease of computation. Accordingly, assuming a light pulse is generated and propagated down an optical fiber or wave guide, the propagation speed of such a pulse will be on the order of 30 centimeters per nanosecond of travel time (more particularly about 20 centimeters per nanosecond where the index of refraction of a typical optical fiber is on the order of about 1.5). Thus, a gigahertz timing signal might well be understood as comprising multiple 30 centimeter paths, with each 30 centimeter path length defining the fundamental one nanosecond timing interval.

Figure 4:
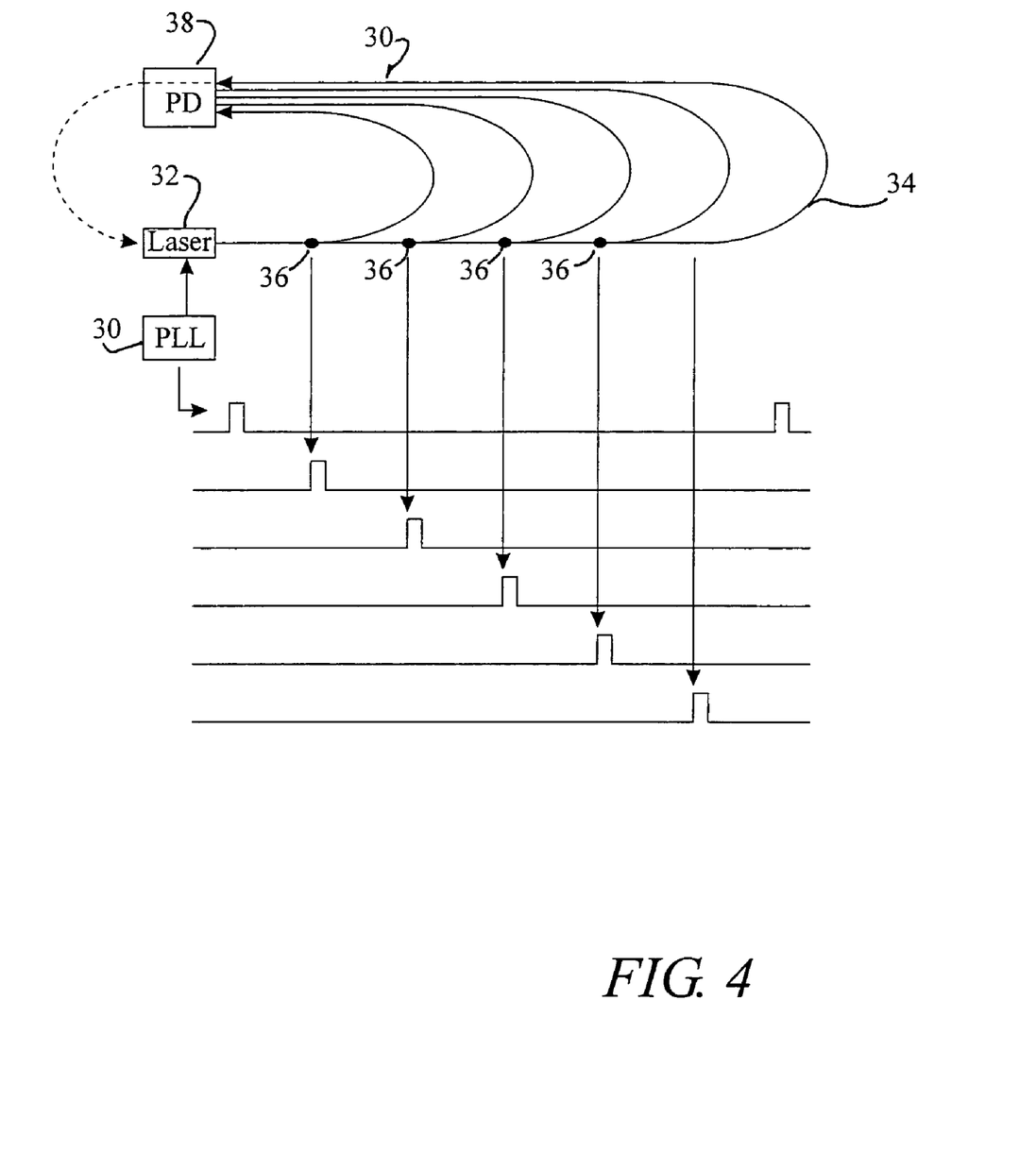
FIG. 4 is a simplified, semi-schematic diagram of one embodiment of an optical timing system in accordance with the invention.

Turning now to FIG. 4, an optoelectronic timing device, in accordance with the invention is depicted in a simplified, semi-schematic form and is configured to define a native one gigahertz timing device operating in an open-loop mode with a 200 megahertz trigger. In the exemplary embodiment of FIG. 4, a 200 megahertz phase lock loop (PLL) 30 operates at 200 megahertz and provides a trigger signal to a semiconductor laser 32 so as to develop a high power output pulse, in a manner described above. The laser 32 develops an output pulse which is propagated over an optical fiber or wave guide 34 which is substantially 150 centimeters in length and which further comprises taps 36 at equal 30 centimeter intervals along the length of the fiber or wave guide. Each of the taps 36 defines a path to a corresponding photodetector circuit or a centrally disposed photodetector circuit 38, so as to define a set of sequential signal sources, each source defining a timing signal one nanosecond following the previous signal source.

Since the PLL 30 is operating at 200 megahertz, the semiconductor laser 32 fires off a new optoelectronic pulse every 200 megahertz. Each pulse is propagated down the fiber or wave guide 34 and sequentially causes the photo detector 38 to receive a quantum of the optoelectronic pulse and generate an electrical signal in operational response thereto. Thus, a 200 megahertz PLL is able to define a one gigahertz native timing signal, without reliance upon integrated circuit electronic switching characteristics. Further, it will be understood by those having skill in the art, that since the timing properties of the resultant signal depend solely upon a known distance parameter between photo detectors, the resultant timing signal will be stable and internally self consistent and repeatable with respect to pulses generated by the optical system.

In the exemplary embodiment of FIG. 4, it should be understood that the only timing jitter introduced to the system will result from timing irregularities of the 200 megahertz PLL. Since it is relatively straight forward to accommodate for jitter and other timing abnormalities in 200 megahertz systems, an optoelectronic timing device, in accordance with the invention, will be understood to exhibit the stability and precision characteristics associated with relatively low speed technologies, while defining native timing pulses operating in the gigahertz regime.

It should further be understood that the exemplary embodiment in FIG. 4 has been described in terms of an open loop system with optical pulses initiated by an external trigger device, such as a PLL. Alternatively, the apparatus can be constructed to operate in closed loop fashion by having the vestigal optical pulse retrigger the semiconductor laser 32 at the same time that it generates an electrical pulse through the final length of the fiber or wave guide and thence to the photodetector. In order to accommodate this function, the fiber or wave guide could be disposed in a circular arrangement or by defining a folded optical path, as is well known as those having skill in the art. Accordingly, the system should be understood as contemplating open loop as well as closed loop operation without violating the spirit of the invention.

The exemplary embodiment of FIG. 4 was described in order to develop an appreciation of the fundamental features of an optoelectronic device that operates in accordance with the invention. The system need not be limited to a 200 megahertz trigger, nor need the system be limited to one gigahertz operation, by defining the individual wave guide segments in terms of 30 centimeters. Indeed, a 10 gigahertz optoelectronic timing device is able to be produced with current technology, by implementing the various elements in Gallium Arsenide (GaAs) integrated circuit technology rather then the more prosaic and conventional silicon. GaAs integrated circuit chips allow for inherently faster operational response times because of their inherently lower parasitic capacitances, as well as allow a semiconductor laser to be fabricated in situ during the device manufacturing process. Such a laser system (termed a vertical cavity surface emitting laser or VCSEL)

would negate the need for providing and bonding a separate semiconductor laser chip onto a silicon integrated circuit. The cost savings more then compensate for the additional manufacturing costs of GaAs integrated circuit technology.

In order to overcome the output power limitations known to apply to VCSEL lasers, multiple VCSELs are fabricated in GaAs and directed into a 100 micron lightguide. 10 VCSELs may easily be fabricated in GaAs to fit into the footprint required for a 100 micron lightguide. Thus, 10 VCSELs can be triggered simultaneously into the wave guide in order to obviate the output power limitations of an individual laser.

From the discussion of the exemplary embodiments of FIG. 4, it will be straight forward for one having ordinary skill in the art to understand that a 10 gigahertz optoelectronic timing device will have a 2 nanosecond loop time for a single laser (or simultaneously initiated set of lasers). A 2 nanosecond loop time is accomplished by utilizing appropriately devised path lengths hosting optical pulses generated by a closed loop system, as described above, or by utilizing a 500 megahertz oscillator (PLL) to trigger the laser system. In this regard, the optical pulse width is contemplated as being less then 200 picoseconds and, preferably, less than 100 picoseconds when the system is utilized as a 10 gigahertz clock.

It should also be noted, that for a 2 nanosecond loop time, the overall length of the optical fiber or wave guide which is required to support 2 nanosecond travel time will be on the order of 60 centimeters.

Figure 5:
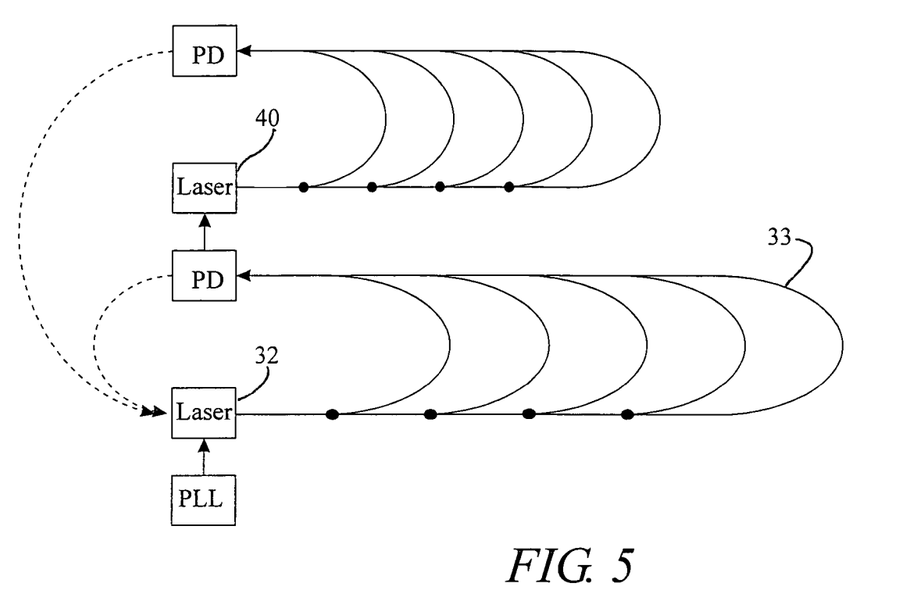
FIG. 5 is a simplified, semi-schematic diagram of a second embodiment of an optical timing system in accordance with the invention.

Turing now to the exemplary embodiment of FIG. 5, there is shown in simplified, semi-schematic form, a 10 gigahertz timing system, generally similar to the exemplary embodiment of FIG. 4, but comprising a cascade laser system defining two timing portions. Each of the portions is generally similar to the embodiment of FIG. 4, with a semiconductor laser 32 being triggered by a PLL trigger device, or equivalent, and is shown as directing optical pulses down a primary optical fiber or wave guide 33, comprising suitably disposed taps leading to a primary photo detector 34. However, as each pulse generates a signal in the primary photodetector, the primary signal is seen as triggering a secondary laser, identified by the numeral 40, which, in turn, develops an optical pulse down the second portion of the timing system.

The second portion of the timing system in FIG. 5 is structurally identical to the first portion and only differs from the first portion in having it's laser triggered by each vestigal optical pulse as opposed to being triggered by an electronic timing oscillator, for example. In a sense, the exemplary embodiment of FIG. 5 can be thought of a quasi open and closed loop system in combination. It will further be understood that the system may be implemented in a completely closed loop fashion by merely completing the circuit between the second portion of the timing device and the pulse initiation laser 32 in a manner described above in connection with FIG. 4. Briefly the exemplary embodiment of FIG. 5 is provided solely as an example of how lasers and fiber/wave guides maybe cascaded in order to define primary and secondary timing loops. In this regard, it should be understood that a 10 gigahertz timing device maybe formed utilizing several possible combinations of trigger circuits, lasers, wave guides and taps.

For example, a 10 gigahertz timing device might comprise a single optical loop, utilizing a single initiation laser system and including 10 outputs, each cycling through 1 nanosecond. Where the system is closed loop or fired by a 1 gigahertz clock trigger, a simple construction analysis reveals that the system operates at 10 gigahertz. Additionally, such a system might be implemented as a single unit comprising 20 outputs each cycling at 2 nanoseconds where the laser is fired in accordance with a 500 megahertz clock trigger device.

Figure 6:
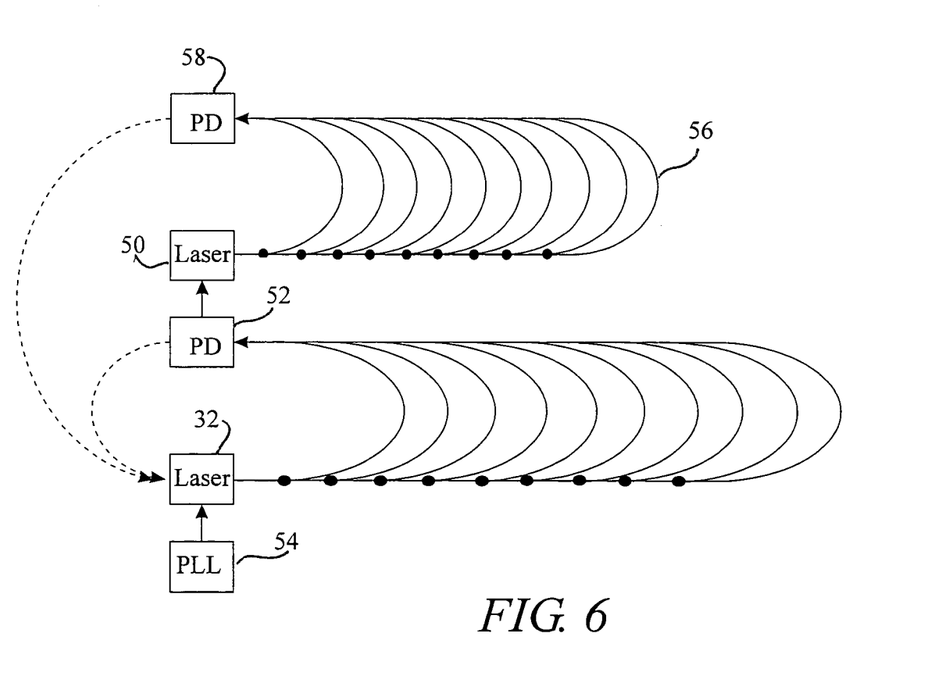
FIG. 6 is a simplified, semi-schematic diagram of an additional embodiment of an optical timing system in accordance with the invention, including a tiered configuration.

In a two-laser system, such as depicted in the exemplary embodiment of FIG. 6, a secondary laser 50 is nested within the primary timing loop, such that a trigger pulse developed by the primary loops' photo detector 52 initiates an optical pulse in the secondary laser system 50. The primary loop cycles at 100 megahertz, by being triggered by a 100 megahertz PLL 54, for example. The primary loop further comprises ten equally-spaced outputs each having a length defining a 10 nanosecond interval. As a pulse traverses a particular leg of the loop, it generates a signal in the primary loops' photo detector, 52 which, in turn, fires off the secondary laser 50. The secondary laser 50 is, therefore, triggered at a 1 gigahertz rate and cycles at 1 nanosecond intervals, by defining a secondary wave guide 56, itself having ten equally-spaced apart outputs so as to define a 10 gigahertz pulse train to the secondary photo detector 58.

Similarly, a 10 gigahertz system might be implemented as primary and secondary units with the primary cycling at 100 megahertz and comprising five outputs: the secondary cycling at 2 nanosecond intervals, i.e., twenty outputs, thereby defining a 10 gigahertz pulse train. This conceptual construction may be easily extended to a three-laser system by an additional level of nesting. A tertiary laser system need only be coupled into the secondary system, such that the tertiary laser is fired by the secondary photo detector electronics, and so forth. Since the actual timing rate is nothing more than an appreciation of a physical distance down a wave guide of optical fiber, it will be immediately understood by those having skill in the art that any number of mechanical arrangements maybe implemented so as to define optical timing pulses having any number of desired characteristics at virtually any technologically feasible speed. Indeed, one of the particular utilities of the invention is it's ability to generate gigahertz region timing signals utilizing very simple and straightforward, relatively low-speed electronic trigger pulses. A 100 megahertz oscillator or PLL is all that is required to initially fire off the system into gigahertz and multiple gigahertz pulse train definition.

Now that the fundamental constructor in operations of an optical timing system, in accordance with the invention, has been described, it would be worthwhile to discuss a few of the timing systems that can be implemented utilizing such technology. Turning now to the exemplary embodiment of FIG. 7, there is shown a precision serial optical timing device, termed herein a "lightclock", that utilizes various aspects of the novel optical timing system, described above. In the exemplary embodiment of FIG. 7, the precision serial lightclock is implemented as a set of nested timing loops, with each timing loop having a loop time of substantially one order of magnitude smaller than the loop time of the proceeding. Specifically, the exemplary embodiment of FIG. 7 describes six optical timing loops, nested within a main, or seventh, loop defined by implementing the system in a closed-loop fashion. Each of the optical loops is defined by an optical fiber which, since the refractive index of optical fiber is typically 1.5, defines an approximately 20 centimeter distance for each required nanosecond.

Figure 7:
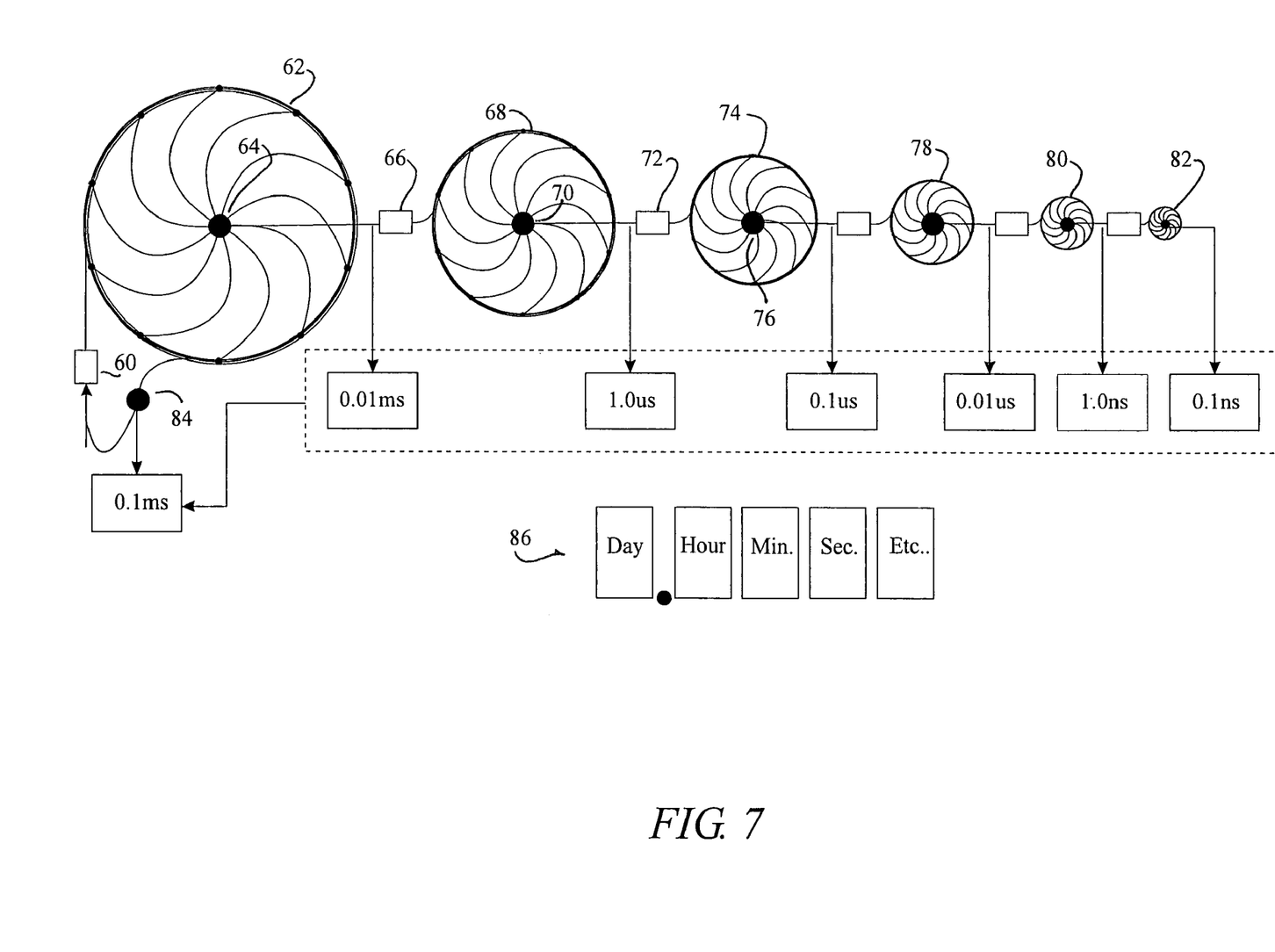
FIG. 7 is a simplified, semi-schematic diagram of one embodiment of a precision optical timing system in accordance with the invention.

As described previously, a semiconductor laser 60 is fired by an initial trigger pulse to define an optical pulse into a first timing loop 62. The first timing loop 62 is contemplated as defining a 0.01 millisecond loop, thereby requiring approximately a 20 kilometer length of fiber, with an approximately 2 kilometer spacing between each of the 10 outputs of the loop. The first optical timing loop 62 defines an output by having each of the fiber taps provide a signal to a centrally disposed photo detector 64 which, in turn, provides the trigger signal to a next-level laser diode 66 which develops an optical pulse to the next-level optical loop 68. The next-level optical loop 68 is defined as a 1.0 microsecond loop, thereby requiring an overall 2 kilometer distance for the loop fiber, with each of 10 outputs being spaced approximately 200 meters apart. As before, each of the outputs is directed to a centrally disposed photo detector 70 which necessarily receives optical signals at one microsecond intervals. Further, the photo detector 70 provides the necessary trigger pulse to a next-level semiconductor laser 72 which defines an optical pulse into the third-level (0.1 microsecond level) optical path 74. Spacing between outputs in the third-level optical path are necessarily 20 meters apart in order to define a 0.1 microsecond pulse train to the centrally disposed photo detector 76.

Similarly, forth, fifth, and sixth optical loops (78, 80 and 82, respectively) function just as described previously, with their respective output spacing being 2 meters, 20 centimeters and 2 centimeters, in order to ultimately provide a 100 picosecond pulse train from the final timing loop.

Returning momentarily to the first-level loop of the system, it should be noted that the kilometer fiber terminates in a further photo detector 84 which is used to retrigger the initial semiconductor laser 60 in closed-loop fashion. Accordingly, the initial semiconductor laser 60 operates at approximately 0.1 millisecond intervals. Also, each of the photo detectors (64, 70, 76, and the like) have an output coupled to a corresponding incremental counter (indicated collectively at 86) that offers a count-up methodology by which seconds, minutes, hours, days, etc., can be simply and easily accounted for in order to translate the optical timing loops of the system into a rigorous and extremely accurate precision time keeping device.

The system described in the exemplary embodiment of FIG. 7 can be easily constructed by having a semiconductor-type laser pigtailed to an optical fiber, such as SMF 28, or the laser might be a component of an optoelectronic integrated circuit (OEIC) or a component of a printed circuit board. Either a printed circuit board or an OEIC implementation is able to incorporate the optical fibers, photo detectors, initiation/trigger driver, and integral lasers, or any subset of these components. Additionally, a printed circuit board or OEIC implementation is able to accommodate a free space adjustment gap, between the optical fibers and photo detectors, at any level, such that fine-tuning can be precisely performed for path length variations. Such fine-tuning allows manufacturing tolerances of the fiber system to be less rigid and is also able to compensate for any changes in path length that might occur after component placement or replacement.

Optical pulse division is performed by either a waveguide or with sequential optical taps disposed along the length of the optical fiber. In the exemplary embodiment of FIG. 7, ten optical outputs are defined at each level, but this is only for purposes of convenience of description. Any number of optical outputs might be provided for any and all of the different levels of the optical loops depending upon the desire of the system designer. Further, optical taps may be configured to pass any percentage of the input optical pulse that is required for system performance. That is well understood by those having skill in the art optical taps may be defined that taps 10%, 25%, 50%, 75%, or the like, of the input optical pulse. Likewise, a waveguide division of an optical pulse may be of any percentage desired by system requirements. By varying the percentage of a pulse that is transmitted into branching fibers, it is possible to make the output pulse amplitudes all equal, or make the output pulse amplitudes different for each branch in the loop. Suitably, a laser pulse maybe split after the laser by means of an OEIC waveguide, a waveguide on a printed circuit board, a waveguide disposed in line with an optical fiber, or by means of individual fiber taps splitting off a single fiber. The latter option decreases fiber bulk, but if implemented care should be taken to minimize defects in any of the fibers or fiber branches. However, an error in measurement of an individual branches' length (fiber or wave guide) could be compensated for by adjusting any available free space gap disposed prior to the photo detector. Inline amplification, where necessary, maybe provided anywhere within the optical path by a rare-earth doped amplifier (ie EDFA), as is well understood by those having skill in the art. If inline optical amplification is required, it would be generally desirable to utilize a 1550 nanometer laser in order to accommodate well understood amplification methodologies. This is the only foreseeable constraint on laser wavelength.

In order to compensate for any possible relativistic effects that might occur during the usage, an optical comparator, to be described in greater detail below, can be disposed in any of the loops, but is preferably disposed in the initial loop of the system. The optical compensator is a device for relatively advancing or delaying an optical pulse within a set pathway by comparing two light pulses and diverting one or the other pulse into a delaying or advancing side pathway, as a means to get the two light pulses into synchronization.

In an additional aspect, the invention contemplates the use of a side optical pathway to advance or delay an optical pulse. A methodology for comparing two light pulses and diverting one or the other of them via optical switches (electrical or optical triggered) into a delaying or advancing side pathway defines a means to get the two light pulses in sync with one another. A methodology for changing the relative position (phase) of a particular light pulse with respect to that of another light pulse by using optical switches to divert said light pulse into delaying and advancing side pathways is also described.

In an optical timing device, as described above, it is relatively important to compensate for any phase differences developed between a previous pulse and a newly generated pulse. In this regard, an optical compensator (OC) defines a device that can be used within an optical timing generator, or any device which needs to advance or delay a light pulse, or to compensate for any internal or relativistic effects that may occur within a device during the transmission of a light pulse within a pathway. Optical compensators are used to adjust the relative phase of a new light pulse within the transmission pathway so that it is in sync with a previously generated light pulse or to just advance or delay a light pulse within the transmission pathway.

The optical compensator device suitably comprises a side path or a set of side pathways where the light pulse is diverted in order to advance or delay its time characteristic (phase) relative to the main pathway. Because each side path is defined in accordance with a particular distance metric, it will be understood that an advancing path will necessarily be shorter than the main pathway. Likewise, a retarding path will suitably comprise a longer distance than the main pathway. Travel along side pathways is implemented by optical switches which divert the light pulse into said side pathway when the optical switches are turned on. Characteristically, optical switches are simply logic gates that define an optical pathway into one branch (waveguide or fiber) upon occurrence of a particular logical state and define an optical pathway into another branch upon occurrence of a second logical state or condition. Optical switching into such pathways can also be made to de-synchronize pulses or to further advance or delay a particular pulse relative to another by changing the logical gating mechanism being used, as will be well understood in the art of logical integrated circuit design.

The individual pathways can be implemented either as a waveguide pathway or an optical fiber pathway, as described previously. Further, optical switches can be of any make that can meet the speed requirements necessary for the device. The optical switches can either be electronically or optically triggered and are contemplated as being all-optical (optical core), optical-electronic-optical (o-e-o configured), optical-mechanical-optical, and particularly implemented as solution switches. Each of these component types are well known to those having skill in the art and further discussion of their construction and implementation would not be particularly germane.

Figure 8A:
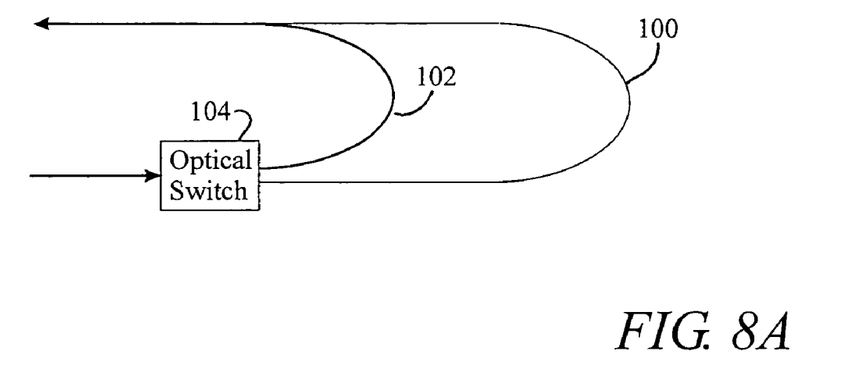
FIG. 8A is a simplified, semi-schematic diagram of one embodiment of a pulse delay optical compensator circuit in accordance with the invention.
Figure 8B:
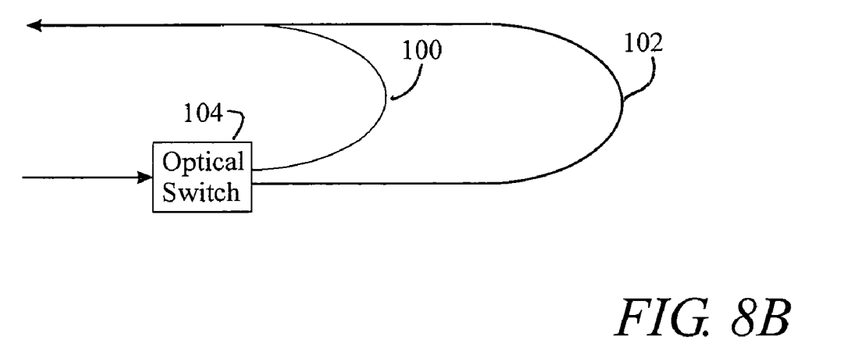
FIG. 8B is a simplified, semi-schematic diagram of one embodiment of a pulse advance optical compensator circuit in accordance with the invention.

A simplified schematic for a delay-type optical compensator, in its most basic form, is given in the exemplary embodiment of FIG. 8A, while a simplified schematic for an advance-type optical compensator, in its most basic form, is given in the exemplary embodiment of FIG. 8B. In both exemplary embodiments, a sidepath 100 is coupled to a main optical pathway 102 by an optical switch 104. As a pulse traverses the system, and it is determined that its phase must be adjusted, the optical switch diverts the pulse either onto an advancing path, a delaying path, or allows the pulse to traverse the main pathway, if desired. Phase adjustment comes into play, for example, if there were a repeatable phase distortion introduced by the pulse regeneration/laser retriggering circuitry. Necessarily, this would cause more of a phase stretch, compelling a more often use of a phase advance pathway.

Figure 8C:
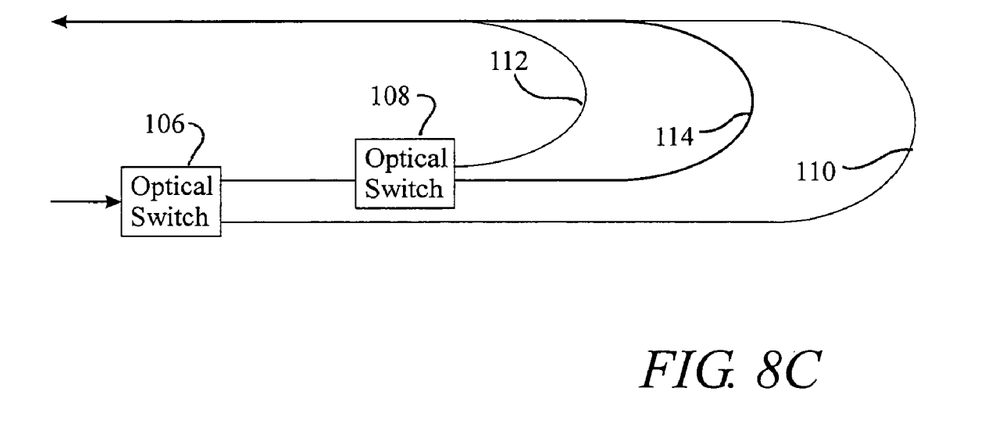
FIG. 8C is a simplified, semi-schematic diagram of one embodiment of a combination pulse delay and pulse advance optical compensator circuit in accordance with the invention.

A simplified schematic for an optical compensator, which is able to either advance or delay an optical pulse such that it is in synchronous relationship with a previous pulse, in the main pathway, is shown in the exemplary embodiment of FIG. 8C. In this embodiment, two optical switches 106 and 108 define entries into delay path 110 and/or advance path 112, respectively, relative to the main optical pathway 114.

Figure 9:
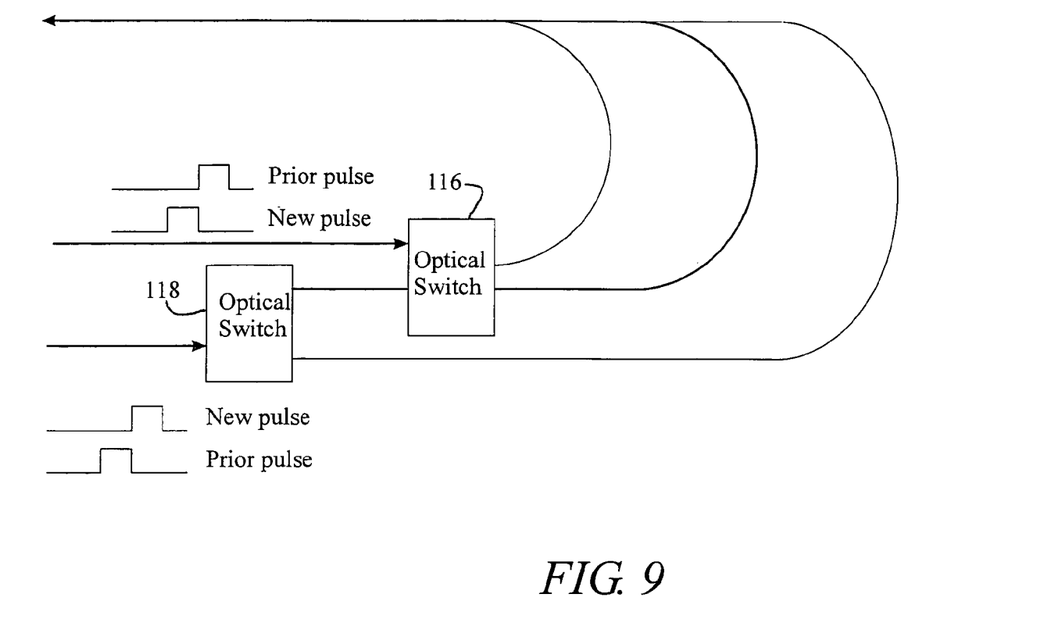
FIG. 9 is a simplified, semi-schematic diagram of one embodiment of an adaptive pulse phase compensator circuit in accordance with the invention.

Further, an optical compensator can be configured to adaptively advance or delay a light pulse such that it is in synchronous relationship with a previous light pulse. One particular embodiment of this feature would allow for compensation for any relativistic, electronic phase shift, or intrinsic mechanical changes that may occur such that would make a newly generated light pulse be out of sync with a previously generated one. A simplified schematic of an exemplary embodiment of such an adaptive phase compensator is shown in FIG. 9.

Figure 10:
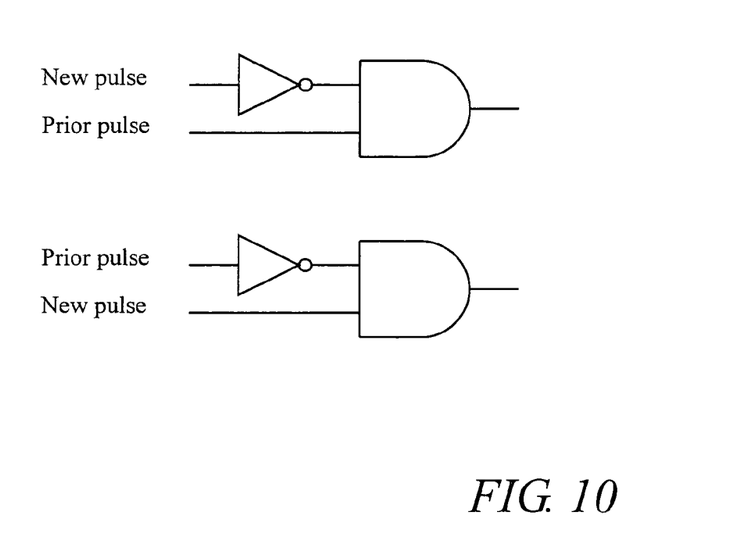
FIG. 10 is a simplified, semi-schematic circuit diagram of one embodiment of a logical gate implementation for pulse delay and advance in an optical compensator circuit in accordance with the embodiment of FIG. 9.

Specifically, optical switches 116 and 118 are controlled by simple logic gates (electronic or optical) that appropriately turn on the correct switch in order to adaptively adjust the phase of a light pulse. The desired action is to turn on optical switch 118 if the new pulse is ahead of the previous one; the switch 118 remains in the off state for all other conditions, while the desired action for optical switch 116 would be to turn on if the previous pulse is ahead of the new one. Further, operation of each of the switches is adaptive in that their operational state is controlled only by the arrival times of both the previous and the new pulse, and not by any external constraints. One relatively simple methodology for accomplishing this feature is to have trigger edges (rising or falling edges) of each of the light pulses at issue condition a set of simple logic gates, the Boolean arguments of which define the required function. In the exemplary embodiment of FIG. 10, a simplified gating diagram for this feature describes an advance and delay switch implemented using a combination NOT-AND gate setup, with inverted input conditions defining whether the gate is operatively responsive as an advance gate or a delay gate.

The rise time for the optical switch is required to be less than the time it would take the new pulse to arrive via the main pathway. The fall time for the optical switch would also require to be faster than the loop time of the main pathway and slower than the greatest possible discrepency that could occur between the new pulse and the previous one. Since the advance and delay pathways are of fixed length, multiple sequential optical compensators could be used with each one having a shorter pathway until they are in sync within the acceptable margin of error (which would typically be less than the pulse width of the light pulse). This can be relatively easily implemented with a switch fabric core configured optical switch (a 1×N configuration).

The optical timing device (lightclock), in accord with the invention is also able to operate as a pulse regenerating closed loop system. The optoelectronic timing device is configured as an OEIC comprising an integrated circuit chip including either a superimposed waveguide or attached optical fibers as the optical pulse propagation path. The lightclock is contemplated as having multiple operational characteristics and is constructed with multitiered loops and/or with multiple lasers: laser(s) for each tier and/or lasers simultaneously being fired for a higher output.

The optical timing device can be used as simple pulse (optical or electrical) output device with a frequency in the MHz or GHz range, or higher as is desired by system timing requirements. The optical timing device is further designed to provide an "intelligent" clocking functionality with a designed patterned output. The patterned output is contemplated as comprising any desired interval between the individual pulses as well as contemplating a predefined variable set of output amplitude characteristics, such that the periodic occurrence of one of a multiplicity of different amplitude pulses defines an internally recursive set of timing triggers. For example, it is well within the contemplation of the present invention to provide an optical timing device that is able to define a 500 MHz timing signal characterized by 300 mV pulse amplitudes while the same pulse train defines a 1 GHz timing signal characterized by 200 mV pulse amplitudes. The 200 mV pulses are interspersed within and between the 300 mV pulses to define a modulated pulse train.

Returning momentarily to the exemplary embodiment of FIG. 6, it can be easily seen that the secondary loop may be devised with a photodetector and ancillary electronics configured to output 200 mV pulses, while the primary loop is configured to output 300 mV pulses. Accordingly, the system can be adapted to output a combination 1 GHz and 10 GHz signal, with the 10 GHz signal internally dependant on the characteristics of the 1 GHz loop.

As described in various other previous exemplary embodiments, the optical timing device can be implemented as either an open or closed loop device. The particular configuration discussed in connection with the exemplary embodiment consists of a single loop or a tiered loop system with a regenerated pulse between each loop. The output can be photonic into a waveguide, optical fiber, or collimated into free space. The output can also be electrical via the addition of a photodetector. In order to provide for an optical pulse having a desirable high pulse amplitude, multiple lasers can be ganged and simultaneously fired, a single laser (or multiple lasers) may be operated at or above its ST threshold, or a single laser (or multiple lasers) may have its output amplified in conventional fashion. If multiple lasers are used simultaneously then each could be provided with its own initial waveguide pathway or multiple lasers could be merged via fiber splicing or waveguide pathway convergence.

As described in connection with the embodiments of FIGS. 5 and 6, if each additional elemental pathway provides an additional travel time of a known amount (an additional 0.2 ns, for example) and the primary loop defined a 1 ns cycle then this particular device would exhibit a 5 GHz output. A suitable photodetector/pulse regenerator (PD-R) could be as simple as a photoconductive switch with a capacitor or an optically triggered FET. An initiator (I) could be as simple as a capacitor trigger to initiate a laser pulse and start the timing cycle. Termination of the closed loop cycling could be achieved by breaking the circuit anywhere between the PD and the laser.

In the multiple laser case, a ganged laser set-up is simultaneously fired, but each laser has its optical pulse directed into a waveguide or fiber having a different length. Thus, a single trigger event causes pulse with multiple arrival times by virtue of the different travel distances. By allowing the different travel paths to be manufactured with different attenuation characteristics, each of the arriving pulses may be characterized by unique pulse amplitudes and even unique pulse widths. By varying the size and the alignment of a waveguide pathway or the splicing percentage of an optical fiber system, different voltage/wattages (electrical/optical output respectively) can be obtained for each discrete pulse in the loop cycle if desired. Also by changing distance between different pulses, the intervals between each pulse in the loop cycle can be different. Various other internal modulation schemes can also be accommodated as desired by the system designer using well known optical and/or electronic modulation methodologies.

Those having skill in the art will immediately understand that several changes and modifications may be made to the embodiments disclosed and described without departing from the scope and spirit of the present invention. The illustrated embodiments allow for a simple conceptual understanding to be had of the present invention and it will be understood that the invention is quite adaptable to numerous rearrangements, modifications and alterations. Accordingly the invention is not to be limited to the specifics of the illustrated and described exemplary embodiments, but is rather to be defined only with respect to the full scope of the appended claims.

The invention claimed is:

1. A timing system comprising:
   at least one semiconductor laser configured to issue sub-nanosecond optical pulses defining a periodic pulse train;
   an optical timing system through which the pulses propagate;
   an optoelectronic system coupled to the optical timing system such that the optoelectronic system generates an electronic timing signal based on propagation of the optical pulses through the optical timing system;
   a first optical waveguide coupled to the optical timing system, the first waveguide being configured to define a first time-quantifiable optical path for a pulse of the train;
   a second optical waveguide coupled to the optical timing system, the second waveguide being configured to define a second time-quantifiable optical path for a pulse of the train different from the first waveguide; and
   an optical switching system coupled to direct one of the pulses from the semiconductor laser through the first optical waveguide or the second optical waveguide depending on when another of the optical pulses emerges from the optical timing system.

2. The system according to claim 1, further comprising:
   a third optical waveguide coupled to the optical timing system and to the optical switching system, the third waveguide being configured to define a third time-quantifiable optical path for a pulse of the train different from the first and second time-quantifiable optical paths, wherein
   lengths of the first, second, and third time-quantifiable optical paths have numerical relationships, such that a pulse traversing the first path defines a nominal travel time, a pulse traversing the second path has a travel time lengthened by a specific quantity with respect to the same pulse traversing the first path, and a pulse traversing the third path has a travel time shortened by a specific quantity with respect to the same pulse traversing the first path.

3. The system according to claim 2, further comprising:
   a first pulse path for the optical pulses from the semiconductor laser; and
   a second pulse path for the optical pulses that have propagated through the optical timing system, wherein
   the first and second pulse paths are operationally coupled to the optical switching system, wherein arrival times of pulses on the first and second pulse paths control operation of the optical switching system such that each pulse from the semiconductor laser is directed through the first, second or third time-quantifiable optical path.

4. The system according to claim 2, wherein the semiconductor laser develops pulses at a rate defining a time spaced-apart fundamental frequency of the optoelectronic timing system.

5. The system according to claim 4, wherein the optical switching system is configured to receive a prior optical pulse that has propagated through the optical timing system and to select whether to direct a new one of the optical pulses from the semiconductor laser through the first, second or third time-quantifiable optical path depending on a synchronization relationship between the prior optical pulse and the new optical pulse.

6. The system of claim 1, wherein the optoelectronic system comprises a photodiode.

7. The system of claim 1, wherein the optical switching system switches an input path for the optical pulses from the semiconductor laser to the optical timing system.

8. The system of claim 7, wherein the optical switching system switches the input path to the optical timing system on relative timing of the optical pulses from the semiconductor laser relative to optical pulses that have propagated through the optical timing system.

9. In an optoelectronic timing system, an optical compensation method for advancing or retarding an optical pulse within a pre-defined pathway, the method comprising:
   configuring at least one semiconductor laser to issue sub-nanosecond optical pulses defining a periodic pulse train;
   configuring a first optical waveguide to define a first time-quantifiable optical path for a pulse of the train;
   configuring a second optical waveguide to define a second time-quantifiable optical path for a pulse of the train different from the first waveguide, wherein the length of the second time-quantifiable optical path has a defined numerical relationship to the length of the first time-quantifiable optical path, such that a pulse traversing the second path has a travel time lengthened by a specific quantity with respect to the same pulse traversing the first path; and operating an optical switching system to direct one of the optical pulses from the semiconductor laser through the first optical waveguide or the second optical waveguide depending on when another of the optical pulses emerges from the optoelectronic timing system.

10. The method according to claim 9, further comprising: configuring a third optical waveguide to define a third time-quantifiable optical path for a pulse of the train different from the first and second waveguide, wherein:

operating the optical switching system directs each pulse from the semiconductor laser through the first, second, or third optical waveguide depending on when another of the pulses finishes propagating through the optical timing system; and wherein the length of the third time-quantifiable optical path has a defined numerical relationship to the length of the first and second time-quantifiable optical paths, such that a pulse traversing the first path defines a nominal travel time, a pulse traversing the second path having a travel time lengthened by a specific quantity with respect to the same pulse traversing the first path, and a pulse traversing the third path having a travel time shortened by a specific quantity with respect to the same pulse traversing the first path.

11. The method according to claim 10, further comprising:
receiving a first of the pulses on a first pulse path from the optical timing system to the switching system; and
receiving a second of the pulses from the semiconductor laser on a second pulse path to the switching system, wherein operating the switching system is such that arrival times of the first and second pulses determine whether the second pulse is directed through the first, second or third time-quantifiable optical path.

12. The method according to claim 9, wherein the semiconductor laser develops pulses at a rate defining a time spaced-apart fundamental frequency of the system.

13. The method according to claim 12, further comprising:
receiving at the optical switching system a prior optical pulse that has propagated through the optical timing system; and
selecting whether to direct a new one of the optical pulses from the semiconductor laser through the first, second or third time-quantifiable optical path depending on a synchronization relationship between the prior optical pulse and the new optical pulse.

* * * * *